(12) United States Patent
Gleissner et al.

(10) Patent No.: US 12,742,252 B2
(45) Date of Patent: Sep. 22, 2026

(54) MODULE KIT FOR A CHEMICAL AND/OR ELECTROLYTIC SURFACE TREATMENT OF A SUBSTRATE

(71) Applicant: Lam Research Salzburg GmbH, Salzburg-Gnigl (AT)

(72) Inventors: Andreas Gleissner, Döbriach (AT); Ulrich Tschinderle, Villach (AT)

(73) Assignee: LAM RESEARCH SALZBURG GMBH, Salzburg (AT)

( * ) Notice: Subject to any disclaimer, the term of this patent is extended or adjusted under 35 U.S.C. 154(b) by 0 days.

(21) Appl. No.: 18/870,111

(22) PCT Filed: May 10, 2023

(86) PCT No.: PCT/EP2023/062501

§ 371 (c)(1),
(2) Date: Nov. 27, 2024

(87) PCT Pub. No.: WO2023/232420

PCT Pub. Date: Dec. 7, 2023

(65) Prior Publication Data

US 2025/0333874 A1 Oct. 30, 2025

(30) Foreign Application Priority Data

May 31, 2022 (EP) .................................... 22176341

(51) Int. Cl.
*C25D 21/00* (2006.01)
*C25D 7/12* (2006.01)
(Continued)

(52) U.S. Cl.
CPC ............... *C25D 21/00* (2013.01); *C25D 7/12* (2013.01); *C25D 17/001* (2013.01); *H10P 72/0424* (2026.01)

(58) Field of Classification Search
None
See application file for complete search history.

(56) References Cited

U.S. PATENT DOCUMENTS

2012/0064225 A1 3/2012 Bachrach et al.
2019/0032240 A1* 1/2019 Gleissner ................. C25D 7/12
2023/0075605 A1* 3/2023 Ötzlinger ............ C25D 17/008

FOREIGN PATENT DOCUMENTS

EP 3 434 815 A1 1/2019
EP 3825445 A1 5/2021
(Continued)

OTHER PUBLICATIONS

International Search Report and Written Opinion for International Application No. PCT/EP2023/062501, dated Aug. 22, 2023.
(Continued)

*Primary Examiner* — Wojciech Haske
(74) *Attorney, Agent, or Firm* — MARSHALL, GERSTEIN & BORUN LLP

(57) ABSTRACT

The present invention relates to a module kit for a chemical and/or electrolytic surface treatment of a substrate, a platform assembly comprising such a module kit, a method for a chemical and/or electrolytic surface treatment of substrates and a use of such a module kit. The module kit comprises a process chamber, a first exchangeable dispense unit for dispensing a first liquid on the substrate, and a second exchangeable dispense unit for dispensing a second liquid on the substrate. The process chamber is dimensioned to receive either the first exchangeable dispense unit or the second exchangeable dispense unit. The first exchangeable dispense unit and the second exchangeable dispense unit are each dimensioned to receive the substrate. The process chamber comprises a kit interface for supplying the first liquid or the second liquid. The first exchangeable dispense unit comprises a first inlet interface for the first liquid. The (Continued)

second exchangeable dispense unit comprises a second inlet interface for the second liquid. The kit interface, the first inlet interface and the second inlet interface are configured for an exchangeable cooperation either between the kit interface and the first inlet interface or between the kit interface and the second inlet interface.

19 Claims, 3 Drawing Sheets

(51) Int. Cl.

| | |
|---|---|
| ***C25D 17/00*** | (2006.01) |
| ***H10P 72/00*** | (2026.01) |

(56) References Cited

FOREIGN PATENT DOCUMENTS

| | | | |
|---|---|---|---|
| EP | 3840024 | A1 | 6/2021 |
| EP | 3 872 236 | A1 | 9/2021 |
| GB | 2564893 | A | 1/2019 |
| GB | 2564894 | A | 1/2019 |

OTHER PUBLICATIONS

Extended European Search Report for European Patent Application No. 22176341.0, dated Jan. 2, 2023.

* cited by examiner 20
21
22
23
24
26
27

20
21
22
23
24
26
27

20
21
22
23
24
28
29

20
21
22
23
24
28
29

MODULE KIT FOR A CHEMICAL AND/OR ELECTROLYTIC SURFACE TREATMENT OF A SUBSTRATE

CROSS-REFERENCE TO RELATED APPLICATIONS

This present application is the US national phase of International Patent Application No. PCT/EP2023/062501, filed May 10, 2023, which claims priority to European Application No. 22176341.0, filed May 31, 2022. These applications are hereby incorporated by reference in their entireties.

TECHNICAL FIELD

The present invention relates to a module kit for a chemical and/or electrolytic surface treatment of a substrate, a platform assembly comprising such a module kit, a method for a chemical and/or electrolytic surface treatment of substrates and a use of such a module kit.

BACKGROUND ART

Many industrial production processes, especially complex semiconductor production lines, require a highly flexible process equipment, which can be adjusted to specific process requirements in a fast and uncomplicated way. It is desired that such adjustments can be performed without major hardware changes to the equipment.

However, a conventional modular processing apparatus, particularly for manufacturing semiconductor devices from silicon wafers by permitting the plural arrangement of independent processing modules in a plurality of track and/or branch configurations, does not provide a rapid adjustment of the processing configuration based on process requirements of an individual substrate.

SUMMARY

Hence, there may be a need to provide an improved substrate treatment system, which comprises a universal design of interfaces, which permits fast and highly reliable adaptation of the processing environment for individual substrates.

The problem is solved by the subject matter of the independent claims of the present invention, wherein further embodiments are incorporated in the dependent claims. It should be noted that the aspects of the disclosure described in the following apply to the module kit for a chemical and/or electrolytic surface treatment of a substrate, the platform assembly comprising such a module kit, the method for a chemical and/or electrolytic surface treatment of substrates and the use of such a module kit.

According to the present invention, a module kit for a chemical and/or electrolytic surface treatment of a substrate is presented. The module kit comprises a process chamber, a first exchangeable dispense unit for dispensing a first liquid on the substrate, and a second exchangeable dispense unit for dispensing a second liquid on the substrate. The process chamber is dimensioned to receive either the first exchangeable dispense unit or the second exchangeable dispense unit. The first exchangeable dispense unit and the second exchangeable dispense unit are each dimensioned to receive the substrate. The process chamber comprises a kit interface for supplying the first liquid or the second liquid. The first exchangeable dispense unit comprises a first inlet interface for the first liquid. The second exchangeable dispense unit comprises a second inlet interface for the second liquid. The kit interface, the first inlet interface and the second inlet interface are configured for an exchangeable cooperation either between the kit interface and the first inlet interface or between the kit interface and the second inlet interface.

The module kit according to the present invention allows a flexible design of the exchangeable process chamber. In other words, the module kit may enable an easy modification of the exchangeable dispense units within the process chamber based on requirements of the substrate treatment. Further, the module kit may be optimized for a minimum space without adjusting liquid supply and drain connections. Since the interfaces between the process chamber and the exchangeable dispense units may be standardized, a quick and easy change of chambers can be realised without adjusting the interfaces between the process chamber and the exchangeable dispense unit.

The module kit may be adapted to form a modular structure of several module kits. The module kit may be configured to perform a chemical surface treatment and/or an electrolytic surface treatment. The wet processing, e.g. the chemical surface treatment and/or the electrolytic surface treatment may allow a high chemical selectivity, which can be achieved with various process liquids (such as acids, bases, oxidizers, etc.) or simple or complex mixtures thereof. In addition, the wet processing allows an inherent simplicity of the processing, scalability of the process to various types of substrates having various sizes and a low cost of operation.

The chemical and/or electrolytic surface treatment of the substrate may be any material deposition, galvanizing coating, chemical or electrochemical etching, cleaning, removal, anodal or purely chemical oxidation, metal separation process or the like. The substrate may comprise a conductor plate, a semi-conductor substrate, a film substrate, an essentially plate-shaped, metal or metallized workpieces or the like. At least one substrate may be held by a substrate holder and immersed in the process chamber for the surface treatment.

The substrate holder may be configured to hold one or more substrates. Alternatively, two separate substrate holder fastening two separate substrates may be simultaneously inserted or removed into or from the process chamber via the opening of the lid unit and the process chamber. The process chamber may be adapted to receive or release the substrate holder parallel to an insertion direction of the exchangeable dispense units into the process chamber. Two substrates to be treated in the process chamber may have a same size and/or a same shape. However, they may have the different size and/or the different shape.

The process chamber may be modular, which means, a plurality of process chambers may be connected with each other to provide a highly flexible substrate treatment system. The process chamber may comprise a material, which is compatible with process chemicals, i.e. the first liquid and the second liquid, and required process conditions. The material may be PFA (Perfluoroalkoxy alkane), quartz, PP (Polypropylene), PE (polyethylene), Ta (tantalum) or the like.

The process chamber may be dimensioned such that an individual processing of substrates can be performed appropriate to their size and/or shape. The process chamber may be configured to hold process fluid and/or the electrolyte applied to the surface treatment. The process fluid and/or the electrolyte may be individually selected suitable for the intended application and/or the expected results of the surface treatment.

The process chamber may thus comprise a universal design to allow a flexible surface treatment of the substrate. Meanwhile, the individual substrate treatment in the universal process chamber may be realized by varying the exchangeable dispense unit. In other words, the process chamber may be configured to receive one of diverse exchangeable dispense units adapted to the intended substrate treatment.

Beside the substrate to be treated, the process chamber may be configured to receive one of the first exchangeable dispense unit and the second exchangeable dispense unit. The first exchangeable dispense unit may be configured to provide the first liquid inside the process chamber and the second exchangeable dispense unit may be configured to provide the second liquid inside the process chamber. The first liquid and the second liquid may be the same or different from each other. The first liquid and/or the second liquid may be process fluid, rinsing fluid and/or the electrolyte applied to the surface treatment of the substrate.

The substrate treated by the first liquid may differ from the substrate treated by the second liquid. Alternatively, the same substrate may be firstly treated by the first liquid and subsequently by the second liquid. Also, the same substrate may be firstly treated by the first liquid and subsequently by the second liquid, without exchange of the exchangeable dispense unit.

Preferably, the first exchangeable dispense unit or the second exchangeable dispense unit may be inserted into the process chamber prior to inserting or immersing the substrate in the process chamber.

The term "exchangeable cooperation" may be understood in that each of the first dispense unit and the second dispense unit may be releasably connected to the process chamber based on the process liquid to be applied in the forthcoming surface treatment of the substrate. In other words, if the first exchangeable dispense unit is removed out of the process chamber, the second exchangeable dispense unit may be inserted into the process chamber without any modification or adjustment of the interfaces. Accordingly, the exchangeable cooperation may also refer to an (exchangeable) connection, an exchangeable interface, a universal interface or the like.

The first exchangeable dispense unit may face the substrate to be treated when the substrate is immersed into the process chamber. To uniformly provide the first liquid onto the surface of the substrate, a size and/or a shape of the first exchangeable dispense unit may be adapted to the size and/or the shape of the substrate to be treated. Likewise, the second exchangeable dispense unit may face the substrate to be treated when the substrate is immersed into the process chamber. To uniformly provide the second liquid onto the surface of the substrate, the size and/or the shape of the first exchangeable dispense unit may be adapted to the size and/or the shape of the substrate to be treated.

The first exchangeable dispense unit and/or the second exchangeable dispense unit may comprise a plurality of orifices for distributing the process fluid and/or electrolyte from their interior to the process chamber and/or the substrate. The orifice may comprise, for instance, spray nozzles, jetting holes or the like.

The kit interface arranged at the process chamber may be connected to a first liquid reservoir configured for supplying the first liquid. Hence, the first liquid may be supplied from the kit interface to the plurality of orifices of the first exchangeable dispense unit via the first inlet interface. Alternatively, the kit interface arranged at the process chamber may be connected to a second liquid reservoir configured for supplying the second liquid. Hence, the second liquid may be supplied from the kit interface to the plurality of orifices of the second exchangeable dispense unit via the second inlet interface.

Accordingly, the kit interface, the first inlet interface and the plurality of orifices of the first exchangeable dispense unit may form a passage for the first liquid. Likewise the kit interface, the second inlet interface and the plurality of orifices of the second exchangeable dispense unit may form another passage for the second liquid. The first inlet interface and the second inlet interface may be adapted to flexibly change the passage for the first liquid or the second liquid based on the treatment to be performed onto the surface of the substrate.

In an example, the exchangeable cooperation does not require a change of a tubing in the process chamber, the first exchangeable dispense unit or the second exchangeable dispense unit. The term tubing may be understood as a separate tube or conduit, which connects the process chamber and the first exchangeable dispense unit or the process chamber and the second exchangeable dispense unit.

By directly coupling the kit interface of the process chamber with the first inlet interface of the first exchangeable dispense unit for supplying the first liquid or the second inlet interface of the second exchangeable dispense unit for supplying the second liquid, a quick and simple exchangeable cooperation may be realised. Hence, change of the exchangeable dispense unit based on the application-, process- and/or liquid-specific requirements may be facilitated.

In an example, the kit interface, the first inlet interface and the second inlet interface are further configured for an (exchangeable) transfer of electrical power and/or data either between the kit interface and the first inlet interface or between the kit interface and the second inlet interface. In other words, the kit interface, the first inlet interface and the second inlet interface may allow not only a chemical liquid supply but also electrical and/or data communication therebetween by means of a standardized connection. The standardized electrical connection and/or data connection may facilitate a change of the exchangeable dispense units.

In an example, the exchangeable transfer does not require a change of an electrical connection or a data connection in the process chamber, the first exchangeable dispense unit or the second exchangeable dispense unit. Accordingly, any complex tubing and/or cabling between the process chamber and the exchangeable dispense units may be avoided while reliable fluid, electrical and/or information communication between them may be ensured. Hence, a replacement of the first exchangeable dispense unit by the second exchangeable dispense unit in the process chamber may not affect the exchangeable transfer of the electrical power and/or data.

In an example, the exchangeable cooperation, the electrical connection and/or the data connection either between the kit interface and the first inlet interface or between the kit interface and the second inlet interface is a plug and play cooperation or connection. The term "plug and play" may be understood in that the first exchangeable dispense unit and/or the second exchangeable dispense unit may be used (in other words, may be ready for usage) as soon as they are connected to the process chamber.

The plug and play cooperation or connection may be available, since the exchangeable cooperation does not require a change of a tubing, an electrical connection or a data connection in the process chamber, the first exchangeable dispense unit or the second exchangeable dispense unit when replacing the exchangeable dispense unit. Accordingly, the first exchangeable dispense unit may be ready to use directly after the first inlet interface is connected to the kit interface and/or the second exchangeable dispense unit may be ready to use directly after the second inlet interface is connected to the kit interface. Hence, a quick and uncomplicated installation of the module kit in a fabrication environment may be achieved.

In an example, the kit interface is either connectable to an etching liquid supply for providing the first liquid or connectable to a different etching or plating liquid supply for providing the second liquid. The first liquid may be the etching liquid and the second liquid may be a different etching liquid or the plating liquid. The kit interface may be adapted to be connected to both of the etching liquid supply and the different etching or plating liquid supply at the same time. The kit interface may be thus able to deliver the etching liquid via the first inlet interface to the process chamber and/or the different etching or plating liquid via the second inlet interface to the process chamber.

The module kit may be configured for a thin metal-layer etch process, which require a highly controllable etch rate and a high etch uniformity over the entire surface of the substrate. Thus, the substrate may be immersed into the first liquid provided via the first exchangeable dispense unit, which may be used to fill the chamber with the first liquid before the immersion of the substrate, enabling an etch process under a controlled diffusion rate of the reactive species through an established diffusion boundary layer on the substrate. Further, the boundary layer may be made thinner in a controlled manner by the second liquid provided via the second exchangeable dispense unit, wherein the second liquid may be a different liquid or the same liquid as the first liquid. The first liquid to be provided in the chamber before the substrate is immersed, may be also provided through a liquid inlet at the bottom of the process chamber. In addition, the process chamber may be equipped with an overflow and recirculation system, allowing the first liquid and/or the second liquid to be continuously recirculated through an e.g., pumping system, potentially including a liquid filtration, a purification and/or a reconditioning system.

The module kit may be also configured for plating the surface of the substrate. During plating, the substrate may be treated purely chemically by applying an ionic fluid or electrochemically by applying an electrolyte and electric current, i.e. electroplating. The substrate can also be electrically connected to a power supply system with a second material known to the skilled in the art within the system acting as a counter-electrode capable to acting as an anode and/or a cathode.

In an example, the first exchangeable dispense unit and/or the second exchangeable dispense unit comprises spray nozzles for a spray application of the first or second liquid to the substrate and/or jetting holes for an immersion application of the first or second liquid to the substrate. The spray nozzles or jetting holes may be arranged at the first exchangeable dispense unit and/or the second exchangeable dispense unit such that the first liquid and/or the second liquid may be reliably and uniformly distributed onto the surface of the substrate to be treated. For instance, the spray nozzles or jetting holes may be evenly spaced apart from each other along a vertical, horizontal, radial direction of the first exchangeable dispense unit and/or the second exchangeable dispense unit.

The first exchangeable dispense unit and/or the second exchangeable dispense unit may comprise two dispensing elements, which may be arranged parallel to each other. Each of the dispensing elements may be configured for the spray application or the immersion application independently of each other. The substrate holder, thus the substrate to be treated, may be insertable or extractable between the dispensing elements.

For the spray application, the first exchangeable dispense unit and/or the second exchangeable dispense unit may comprise a plurality of spray bars dispersing the first liquid spray and/or the second liquid spray in the process chamber. Preferably, each spray bar may comprise a plurality of spray nozzles for ejecting the first liquid spray and/or the second liquid spray in direction to the surface of the substrate to be treated. The spray bars may be arranged in a vertical direction or in a horizontal direction relative to the process chamber.

For the immersion application, each of the first exchangeable dispense unit and/or the second exchangeable dispense unit may comprise a distribution body. The distribution body may be formed as a frame or solid surface comprising a plurality of jetting holes for distributing the first liquid and/or the second liquid in the process chamber. For instance, the distribution body may be plate-shaped. The jetting holes may extend from the inside the distribution body to an active surface of the distribution body facing the substrate to be treated.

Preferably, the plurality of jetting holes may be arranged at or within the distribution body such that they are directed at least inclined or in a perpendicular direction relative to the surface of the substrate to be treated, when the substrate is immersed in the process chamber. Alternatively or additionally, the jetting holes may be arranged at the first exchangeable dispense unit and/or the second exchangeable dispense unit having a specific arrangement pattern. Accordingly, a liquid-distributing area of the jetting holes on or within the distribution body may be adapted to the size and/or shape of the substrate to be treated. Particularly, the distribution body may be a part of a High-Speed-Plate (HSP) system.

In an example, both of the first exchangeable dispense unit and the second exchangeable dispense unit may be configured for the spray application. Alternatively, both of the first exchangeable dispense unit and the second exchangeable dispense unit may be configured for the immersion application. Further, the first exchangeable dispense unit may be configured for the spray application and the second exchangeable dispense unit may be configured for the immersion application and vice versa. In addition, the dispensing elements of each exchangeable dispense unit may be formed symmetrically or differently from each other.

In an example, the module kit is arranged for a surface treatment of a vertically arranged substrate holder and/or substrate. In other words, the module kit may be configured to receive the substrate in a vertical direction relative to the process chamber. Since the substrate may be preferably held by the substrate holder, the substrate holder may be insertable or removable into or from the process chamber in the vertical direction. The substrate holder may comprise several chuck elements for holding a large size substrate. Accordingly, an easy handling of substrates may be achieved and a compact construction of the module kit may be realised.

In an example, the process chamber comprises an opening for receiving the first exchangeable dispense unit or the second exchangeable dispense unit, wherein the opening is arranged at a top surface of the process chamber. In other words, the first exchangeable dispense unit or the second exchangeable dispense unit may be also capable to be inserted or removed into or from the process chamber in the vertical direction through the opening. Since the opening is arranged at top surface of the process chamber, handling of both exchangeable dispense units and the substrate may be easily aligned with each other.

In an example, the module kit may further comprise a lid unit arranged at a top surface of the module kit, which comprises a lid configured for an insertion and/or extraction of the substrate holder. The lid unit may comprise a single lid element or two separate lid elements. The lid unit may comprise an opening which may be aligned with the opening of the process chamber to provide a passage for the substrate holder or the substrate into the process chamber. The lid unit may be configured to prevent the interior of the process chamber from any contamination and/or to avoid that toxic or corrosive chemical fumes are escaping the process chamber. The lid unit can be also made moveable between an open and closed position.

In an example, the lid unit may comprise an exhaust. The exhaust may be integrated in the lid unit and configured to remove chemical vapours out of the process chamber into a save area, where chemical vapours can be treated accordingly to health, safety and environmental standards.

In an example, the first exchangeable dispense unit is dimensioned for a first substrate and the second exchangeable dispense unit is dimensioned for a second substrate, which is larger than the first substrate.

The first substrate inserted into the process chamber may face the first exchangeable dispense unit and later on the second substrate immersed into the process chamber may face the second exchangeable dispense unit. Hence, if the first substrate is larger than the second substrate, the first exchangeable dispense unit for the first liquid may be also lager than the second exchangeable dispense unit for the second liquid. Further, if the second substrate is larger than the first substrate, the second exchangeable dispense unit for the second liquid may be also lager than the first exchangeable dispense unit for the first liquid.

Additionally or alternatively, a liquid-distributing area, which can be defined by an area of the spray nozzles or jetting holes at or within the first exchangeable dispense unit or the second exchangeable dispense unit, may be also adapted with respect to the size of the substrate to be treated. Hence, if the first substrate is larger than the second substrate, the liquid-distributing area of the first exchangeable dispense unit for the first liquid may be also lager than the liquid-distributing area of the second exchangeable dispense unit for the second liquid. Further, if the second substrate is larger than the first substrate, the liquid-distributing area of the second exchangeable dispense unit for the second liquid may be also lager than the liquid-distributing area of the first exchangeable dispense unit for the first liquid.

Accordingly, an individual chemical and/or electrolytic surface treatment of the substrates may be realized.

In an example, the module kit further comprises a substrate size adjustment element to align the first exchangeable dispense unit or the second exchangeable dispense unit with a substrate of a specific size. The substrate size adjustment element may be configured for receiving information about the size or shape of the substrate to be treated and selecting a suitable exchangeable dispense unit for the substrate. Accordingly, the first exchangeable dispense unit or the second exchangeable dispense unit may be chosen appropriate to the individual substrate to be treated.

In an example, the module kit further comprises an agitation unit configured to agitate a substrate holder for the substrate in at least one of three possible directions. The agitation unit may be arranged at the substrate holder or at the top surface of the module kit to adjust a position of the substrate holder, thus the substrate, when the substrate is inserted into the process chamber. The agitation unit may adjust the position in the vertical direction, horizontal direction and/or transverse direction to optimize the position of the substrate relative to the first exchangeable dispense unit or the second exchangeable dispense unit, thus to increase quality of the surface treatment.

In an example, the module kit further comprises an anode. For an electrochemical surface treatment of substrate, the anode may be arranged in the process chamber. If the process chamber contains an electrolyte provided via the first exchangeable dispense unit or the second exchangeable dispense unit, an electric current distribution can be directed from an anode towards the substrate surface to be treated, wherein the substrate may act as the cathode. The anode may be made soluble or insoluble in the first liquid and/or the second liquid. The anode may be arranged in a way that the anode does not interfere with the liquid flow distribution between the exchangeable dispense units and the substrate.

In an example, the process chamber further comprises a temperature control unit, an electromagnetic radiation source, an ultrasonic unit and/or a liquid outlet. The temperature control unit may be configured to control the temperature of the process chamber, particularly, the first liquid, the second liquid and/or a mixture thereof. The temperature control unit may comprise infra-red radiation source, heat exchangers, etc. Specifically, the electromagnetic radiation source may be configured not only for the temperature control, but also photon-initiated etching, e.g. by utilizing UV light.

The ultrasonic unit may comprise, for instance ultrasonic transducers, and it may be configured for facilitating liquid agitation inside the process chamber at the frequency range from a few Hz to some millions of Hz. The liquid outlet is configured to release the process liquid from the process chamber after the chemical and/or electrolytic surface treatment of substrates. Hence, the liquid outlet may be preferably arranged at a bottom side of the process chamber.

According to the present invention, a platform assembly for a chemical and/or electrolytic surface treatment of a substrate is presented. The platform assembly comprises a first module kit as described above and an equipment platform. The first module kit comprises a first kit interface and the equipment platform comprises a platform interface. The platform interface and the first kit interface are configured for an exchangeable cooperation between the first kit interface and the platform interface. The platform assembly may allow a rapid and instant change of the module kit according to the process-specific requirements.

The equipment platform may be adapted to permit fast and highly reliable adaptation of the processing environment for individual substrates, which may be realized by the standardized platform interface and the kit interface. Thus, the cooperation of the platform interface and the first kit interface may be formed exchangeable, which may facilitate the change of the module kit.

The equipment platform may provide one or more liquid inlets and liquid outlets, electric supply means, data communication means etc. Accordingly, as soon as the module kit is mounted at the equipment platform via the kit interface and the platform interface, the module kit may be able to be connected to all necessary supply or communication means for performing the substrate treatment.

In an example, the platform assembly further comprises a second module kit with a second kit interface, wherein the platform interface, the first kit interface and the second kit interface are configured for an exchangeable cooperation between the platform interface and either the first kit interface or the second kit interface.

In an example, the equipment platform comprises several platform interfaces configured for an exchangeable cooperation with several kit interfaces of several module kits at the same time.

The equipment platform may be adapted to mount two or more module kits for performing the surface treatment. In other words, the equipment platform may comprise two or more platform interfaces to be connected to the kit interface of each module kit. The platform interfaces and the kit interfaces may comprise a standardized structure such that each cooperation of the platform interface and the kit interface may be formed exchangeable. The process chamber of each module kit may be configured to perform an individual substrate treatment. Thus, each module kit may comprise the same or different exchangeable dispense units.

The equipment platform may provide one or more liquid inlets and liquid outlets, electric supply means, data communication means, etc. Additionally, the equipment platform may be capable to perform an overall control of the module kits. Accordingly, the exchange of one or more module kits may be facilitated even though a reliable supply connection and/or communication may be ensured.

In an example, the exchangeable cooperation does not require a change of a tubing, an electrical connection and/or a data connection in the equipment platform and/or the module kit(s). The standardized kit interface and platform interface may facilitate the change of the module kits. Hence, change of the module kit based on the application-, process- and/or liquid-specific requirements may be also facilitated.

In an example, the exchangeable cooperation, the electrical connection and/or the data connection between the equipment platform and the module kit(s), specifically between the platform interface(s) and kit interfaces(s) may be a plug and play cooperation or connection.

In an example, each platform interface and each kit interface may form together a supply interface. The supply interface may be formed by a plug and play cooperation between the kit interface and the platform interface. This may enable a rapid exchange of the process chamber, in case of a certain process requiring the exchange of the process chamber and not just the exchange of the exchangeable dispense unit. This may be necessary, for instance, in case a chemistry needs to be used, which requires the chamber to be made from a different material for chemical compatibility and safety.

According to the present invention, a method for a chemical and/or electrolytic surface treatment of substrates is presented. The method comprises

- dispensing a first liquid on a first substrate arranged in a first exchangeable dispense unit, wherein the first exchangeable dispense unit is inserted into a process chamber, and wherein a first inlet interface of the first exchangeable dispense unit cooperates with a kit interface of the process chamber,
- removing the first substrate from the first exchangeable dispense unit,
- removing the first exchangeable dispense unit from the process chamber,
- inserting a second exchangeable dispense unit into the process chamber,
- connecting the kit interface of the process chamber with a second inlet interface of the second exchangeable dispense unit,
- inserting a second substrate into the second exchangeable dispense unit, and
- dispensing a second liquid on the second substrate.

The kit interface, the first inlet interface and the second inlet interface are configured for an exchangeable cooperation either between the kit interface and the first inlet interface or between the kit interface and the second inlet interface. The first substrate and the second substrate can be one and the same substrate or two substrates.

Hence, rapid and easy adaptation change the module kits based on the application-, process- and/or liquid-specific requirements may be ensured.

According to the present invention, a use of a module kit as described above is presented. The module kit is suitable for a chemical and/or electrolytic surface treatment of a substrate with a width in a range of 500 to 1700 mm and a length in a range of 505 to 2000 mm, preferably a width in a range of 1300 to 1700 mm and a length in a range of 1600 to 2000 mm or a width in a range of 500 to 520 mm and a length in a range of 505 to 525 mm.

Since the first exchangeable dispense unit and/or the second exchangeable dispense unit may be dimensioned with respect to the size and/or shape of the substrate to be treated, the module kit may be flexibly applied for a wide range of the substrate size. Particularly, the module kit may be also suitable for the surface treatment of a large substrate.

It should be noted that the above embodiments may be combined with each other irrespective of the aspect involved. Accordingly, the method may be combined with structural features and, likewise, the system may be combined with features described above with regard to the method.

These and other aspects of the present invention will become apparent from and elucidated with reference to the embodiments described hereinafter.

BRIEF DESCRIPTION OF DRAWINGS

Exemplary embodiments of the invention will be described in the following with reference to the following drawings.

DESCRIPTION OF EMBODIMENTS

Figure 1:
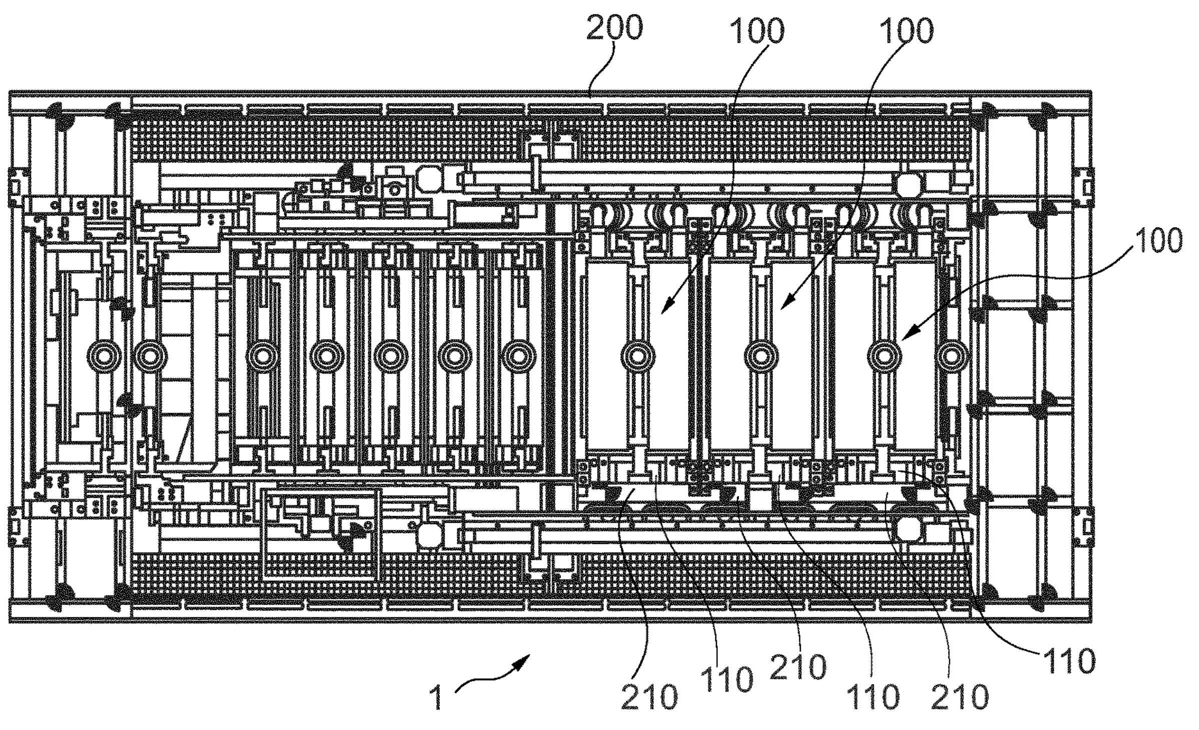
FIG. 1 shows schematically and exemplarily an embodiment of a platform assembly for a chemical and/or electrolytic surface treatment of a substrate according to the present invention.

FIG. 1 shows a platform assembly 1 for a chemical and/or electrolytic surface treatment of a substrate. The chemical and/or electrolytic surface treatment of the substrate may be any material deposition, galvanizing coating, chemical or electrochemical etching, anodal oxidation, metal separation process or the like. The substrate may comprise a conductor plate, a semi-conductor substrate, a film substrate, an essentially plate-shaped, metal or metallized workpieces or the like.

The platform assembly 1 comprises an equipment platform 200 and three module kits 100. Each module kit 100 comprises a kit interface 110 and the equipment platform 200 comprises platform interfaces 210 corresponding to each kit interface 110. Each platform interface 210 and a kit interface 110 form together a supply interface 11 (see also FIG. 2). The platform interfaces 210 and the kit interfaces 110 are configured for an exchangeable cooperation therebetween. The exchangeable cooperation does not require any change of a tubing, an electrical connection and/or a data connection in the equipment platform 200 and/or the module kits 100 when changing one or more module kits 100. The platform interfaces 210 and the kit interfaces 110 may comprise a standardized interface structure such that each cooperation of the platform interface 210 and the kit interface 110 may be formed exchangeable.

Figure 2:
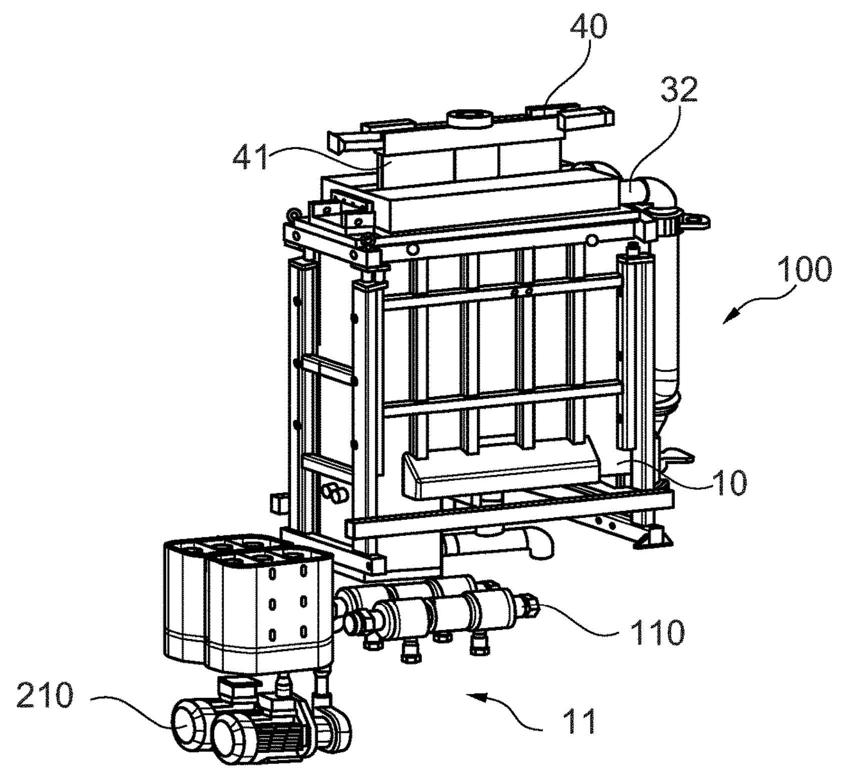
FIG. 2 shows schematically and exemplarily an embodiment of a module kit for a chemical and/or electrolytic surface treatment of a substrate according to the present invention.

As shown in FIG. 2 the module kit 100 is arranged for a surface treatment of a vertically arranged substrate 41 held by a substrate holder 40. The module kit 100 is suitable for a chemical and/or electrolytic surface treatment of a substrate with a width in a range of 500 to 1700 mm and a length in a range of 505 to 2000 mm, preferably a width in a range of 1300 to 1700 mm and a length in a range of 1600 to 2000 mm or a width in a range of 500 to 520 mm and a length in a range of 505 to 525 mm. The substrate holder 40 is insertable or removable into or from a process chamber 10 in a vertical direction, which allows a compact construction of the module kit 100.

Figure 3:
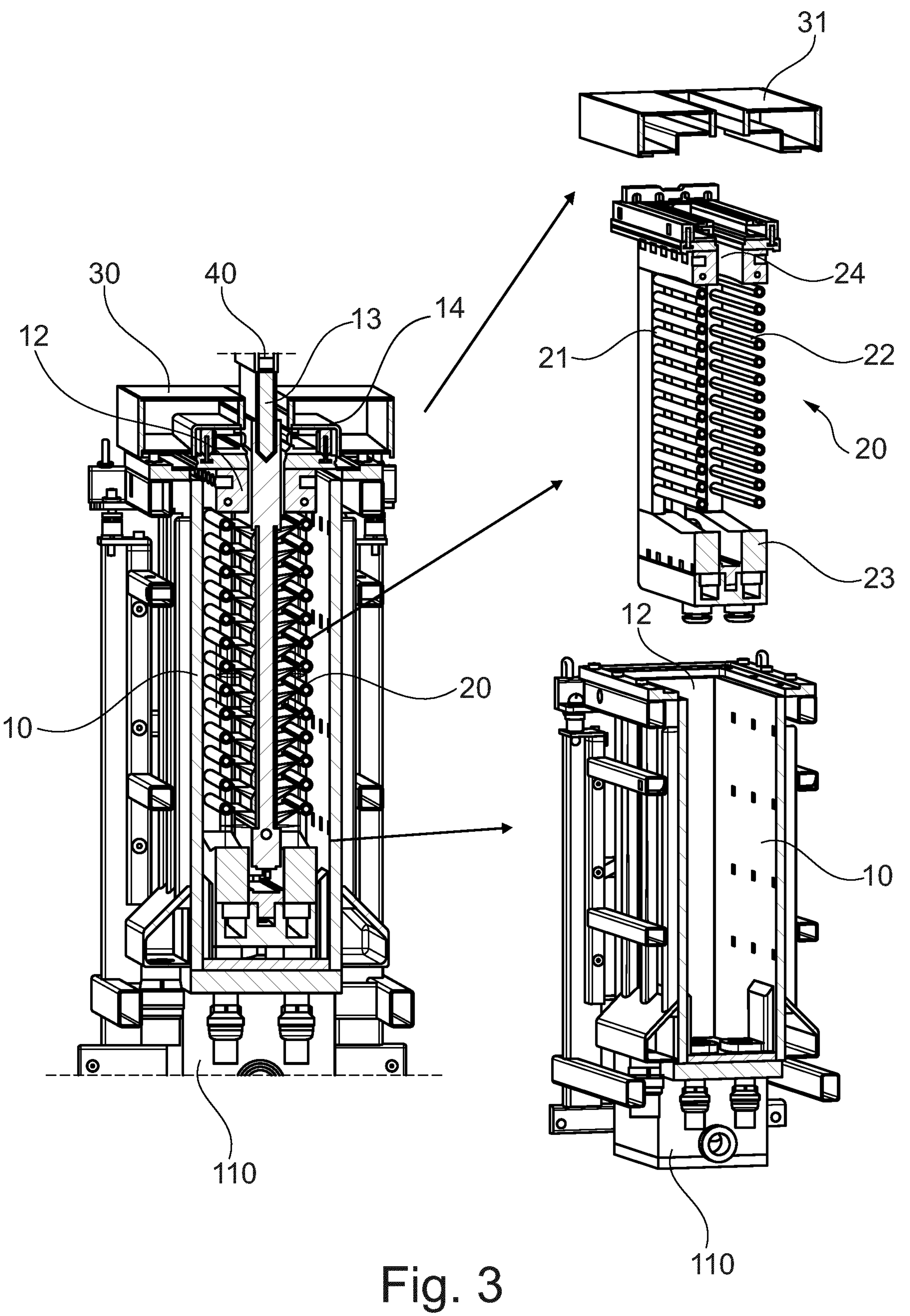
FIG. 3 shows schematically and exemplarily an embodiment of a module kit for a chemical and/or electrolytic surface treatment of a substrate according to the present invention.

FIG. 3 shows such module kit 100 comprising the process chamber 10, a first exchangeable dispense unit 20 or a second exchangeable dispense unit 20. The process chamber 10 comprises an opening 12 at a top surface of the process chamber 10 for receiving the first exchangeable dispense unit 20 and/or the second exchangeable dispense unit 20. In other words, the process chamber 10 is dimensioned to receive the first exchangeable dispense unit 20 and/or the second exchangeable dispense unit 20.

The first exchangeable dispense unit 20 is configured for dispensing a first liquid on the substrate 41 and the second exchangeable dispense unit 20 is configured for dispensing a second liquid on the substrate 41. The first exchangeable dispense unit 20 and the second exchangeable dispense unit 20 are each dimensioned to receive the substrate 41 in their internal cavity 24. The first exchangeable dispense unit 20 and/or the second exchangeable dispense unit 20 may comprise two dispensing elements 21, 22, which may be arranged parallel to each other. Each of the dispensing elements 21, 22, may be configured for a spray application or an immersion application independently of each other. The substrate holder 40, thus the substrate 41 to be treated, may be insertable and/or extractable between the two dispensing elements 21, 22.

The process chamber 10 comprises the kit interface 110 for supplying the first liquid or the second liquid. The first exchangeable dispense unit 20 comprises a first inlet interface 23 for the first liquid. The second exchangeable dispense unit 20 comprises a second inlet interface 23 for the second liquid. The kit interface 110 can be connectable to a platform interface 210, which is connected to an etching liquid supply (not shown) for providing the first liquid or to a different etching or plating liquid supply (not shown) for providing the second liquid.

The kit interface 110, the first inlet interface 23 and the second inlet interface 23 are configured for an exchangeable cooperation either between the kit interface 110 and the first inlet interface 23 or between the kit interface 110 and the second inlet interface 23. Thus, the exchangeable cooperation does not require a change of a tubing in the process chamber 10, the first exchangeable dispense unit 20 or the second exchangeable dispense unit 20.

The kit interface 110, the first inlet interface 23 and the second inlet interface 23 are further configured for an exchangeable transfer of electrical power and/or data either between the kit interface 110 and the first inlet interface 23 or between the kit interface 110 and the second inlet interface 23. Thus, the exchangeable transfer does not require a change of an electrical connection or a data connection in the process chamber 10, the first exchangeable dispense unit 20 or the second exchangeable dispense unit 20.

The exchangeable cooperation, the electrical connection and/or the data connection either between the kit interface 110 and the first inlet interface 23 or between the kit interface 110 and the second inlet interface 23 can be a plug and play cooperation or connection. Accordingly, a quick and easy change of liquid delivery systems, which can be modified process-specifically, can be realized without adjusting the interfaces between the process chambers 10 and the exchangeable dispense units 20.

A quick and easy change of universal chambers 10 can also be carried out because of the standardization and play-and-plug of the platform interfaces 210 and the kit interface 110 forming the supply interface 11.

The module kit 100 further comprises a lid unit 30 arranged at the top surface of the module kit 100, which comprises a lid 31 configured for an insertion and/or extraction of the substrate holder 40. The substrate holder 40 is aligned with the lid 31 and allows the substrate 41 to be positioned between the dispensing elements 21, 22 of the first exchangeable dispense unit 20 or the second exchangeable dispense unit 20 of the module kit 100.

The substrates to be treated in the process chamber 10 may have a same size and/or a same shape. However, they may also have the different size and/or the different shape. Each substrate 41 inserted into the process chamber 10 may face a respective exchangeable dispense unit 20. For instance, the first exchangeable dispense unit 20 can be dimensioned for a first substrate and the second exchangeable dispense unit 20 can be dimensioned for a second substrate, which is larger than the first substrate (it can also be smaller). Hence, if the first substrate is smaller than the second substrate, a liquid-distributing area of the first exchangeable dispense unit 20 for the first liquid may be also smaller than the liquid-distributing area of the second exchangeable dispense unit 20 for the second liquid to improve a quality of the surface treatment.

FIGS. 4*a* to 4*d* show four examples of the first and second exchangeable dispense units 20, which facilitate a reliable and uniform distribution of the first or second liquid onto the surface of the substrate 41 to be treated.

Figures 4A, 4B, 4C, 4D:
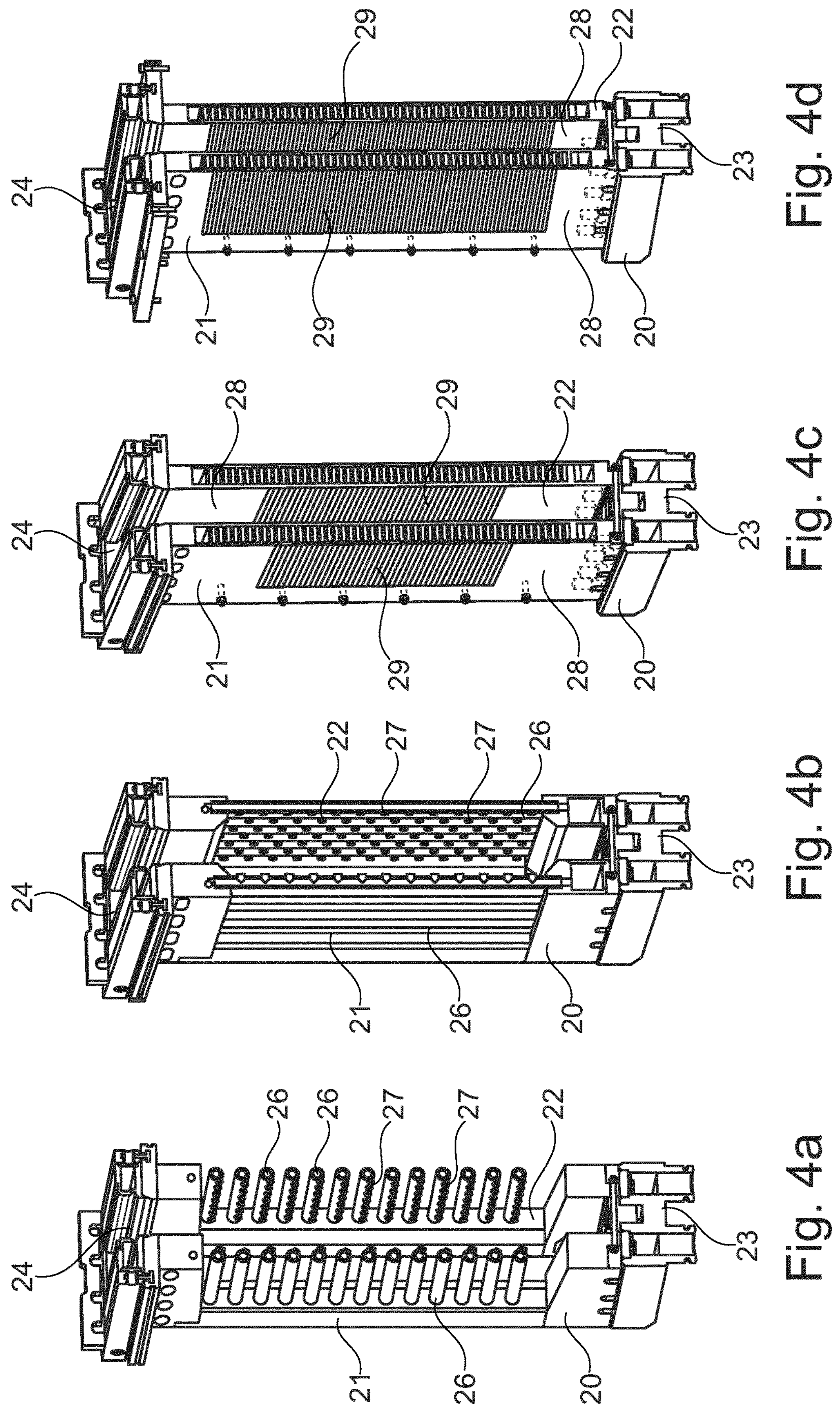
FIGS. 4*a* to 4*d* show schematically and exemplarily embodiments of exchangeable dispense units of a module kit according to the present invention.

As shown in FIG. 4*a*, the exchangeable dispense unit 20 comprises two dispensing elements 21, 22, which are arranged parallel to each other and formed symmetrically. The exchangeable dispense unit 20 can comprise spray nozzles 27 for a spray application of the first or second liquid to the substrate 41. The spray nozzles 27 can be arranged at a plurality of spray bars 26 directed in a horizontal direction of the process chamber 10. Alternatively, as shown in FIG. 4*b*, the spray bars 26 may be arranged in a vertical direction of the process chamber 10.

In FIG. 4*c*, exchangeable dispense unit 20 comprises jetting holes 29 for an immersion application of the first or second liquid to the substrate 41. The jetting holes 29 are arranged at or within a distribution body 28 such that they are directed substantially in a perpendicular direction relative to the surface of the substrate 41 to be treated, when the substrate 41 is immersed in the process chamber 10. Alternatively, the jetting holes 29 may be arranged inclined relative to the surface of the substrate 41 to be treated in an angle. The distribution body 28 may be a part of a High-Speed-Plate (HSP) system. The liquid-distributing area formed by the plurality of jetting holes 29 on or within the distribution body 28 may be adapted to the size of the substrate 41 to be treated, as shown in FIG. 4*c* and FIG. 4*d*.

Alternatively, the dispensing elements 21, 22 of the exchangeable dispense unit 20 can be formed differently or asymmetrically and comprise spray nozzles 27 for the spray application and jetting holes 29 for the immersion application simultaneously.

The process chamber 10 may further comprise a temperature control unit (not shown) for controlling a temperature of the process chamber 10 or the process fluid, an electromagnetic radiation source (not shown) for photon-initiated etching, an ultrasonic unit (not shown) for facilitating liquid agitation inside the process chamber 10 and/or a liquid outlet (not shown) for releasing fluid out of the process chamber 10.

Further, the lid unit 30 comprises an exhaust 32 configured to remove chemical vapours out of the process chamber 10 into a save area, where chemical vapours can be treated accordingly to health, safety and environmental standards.

The module kit 100 further comprises a substrate size adjustment element 14 to align the first exchangeable dispense unit 20 or the second exchangeable dispense unit 20 with a substrate of a specific size (see FIG. 3).

The module kit 100 also comprises an agitation unit 13 configured to agitate a substrate holder 40 for the substrate 41 in at least one of three possible directions. The agitation unit 13 is arranged at the substrate holder 40 to adjust a position of the substrate holder 40, thus the substrate 41, when the substrate 41 is inserted into the process chamber 10. The agitation unit 13 may adjust the position of the substrate holder 40 in the vertical direction, horizontal direction and/or transverse direction to optimize the position of the substrate 41 relative to the first exchangeable dispense unit 20 or the second exchangeable dispense unit 20.

The module kit 100 is configured as a hybrid process equipment allowing etching or (electro-) plating of the substrate 41. Specifically, to perform the electroplating, the module kit 100 can further comprise an anode (not shown) inside the process chamber 10. If the process chamber 10 contains an electrolyte provided via the first exchangeable dispense unit 20 or the second exchangeable dispense unit 20, an electric current distribution is directed from the anode towards the substrate surface to be treated, wherein the substrate 41 may act as a cathode.

Accordingly, the module kit 100 enables an easy modification of the exchangeable dispense units 20 within the process chamber 10 based on requirements of the substrate treatment.

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A module kit for a chemical and/or electrolytic surface treatment of a substrate, comprising:

a process chamber, a first exchangeable dispense unit for dispensing a first liquid on the substrate, and a second exchangeable dispense unit for dispensing a second liquid on the substrate, wherein the process chamber is dimensioned to receive either the first exchangeable dispense unit or the second exchangeable dispense unit, wherein the first exchangeable dispense unit and the second exchangeable dispense unit are each dimensioned to receive the substrate, wherein the process chamber comprises a kit interface for supplying the first liquid or the second liquid, wherein the first exchangeable dispense unit comprises a first inlet interface for the first liquid, wherein the second exchangeable dispense unit comprises a second inlet interface for the second liquid, and wherein the kit interface, the first inlet interface and the second inlet interface are configured for an exchangeable cooperation either between the kit interface and the first inlet interface or between the kit interface and the second inlet interface.

2. The module kit according to claim 1, wherein the exchangeable cooperation does not require a change of a tubing in the process chamber, the first exchangeable dispense unit or the second exchangeable dispense unit.

3. The module kit according to claim 1, wherein the kit interface, the first inlet interface and the second inlet interface are further configured for an exchangeable transfer of electrical power and/or data either between the kit interface and the first inlet interface or between the kit interface and the second inlet interface.

4. The module kit according to claim 3, wherein the exchangeable transfer does not require a change of an electrical connection or a data connection in the process chamber, the first exchangeable dispense unit or the second exchangeable dispense unit.

5. The module kit according to claim 1, wherein the exchangeable cooperation, the electrical connection and/or the data connection either between the kit interface and the first inlet interface or between the kit interface and the second inlet interface is a plug and play cooperation or connection.

6. The module kit according to claim 1, wherein the kit interface is connectable to an etching liquid supply for providing the first liquid and/or connectable to a different etching or plating liquid supply for providing the second liquid.

7. The module kit according to claim 1, wherein the first exchangeable dispense unit and/or the second exchangeable dispense unit comprises spray nozzles for a spray application of the first or second liquid to the substrate and/or jetting holes for an immersion application of the first or second liquid to the substrate.

8. The module kit according to claim 1, wherein the module kit is arranged for a surface treatment of a vertically arranged substrate holder and/or substrate.

9. The module kit according to claim 1, wherein the process chamber comprises an opening for receiving the first exchangeable dispense unit or the second exchangeable dispense unit, wherein the opening is arranged at top surface of the process chamber.

10. The module kit according to claim 1, wherein the first exchangeable dispense unit is dimensioned for a first substrate and the second exchangeable dispense unit is dimensioned for a second substrate, which is larger than the first substrate.

11. The module kit according to claim 1, further comprising a substrate size adjustment element to align the first exchangeable dispense unit or the second exchangeable dispense unit with a substrate of a specific size.

12. The module kit according to claim 1, further comprising an agitation unit configured to agitate a substrate holder for the substrate in at least one of three possible directions.

13. The module kit according to claim 1, further comprising an anode.

14. The module kit according to claim 1, wherein the process chamber further comprises a temperature control unit, an electromagnetic radiation source, an ultrasonic unit and/or a liquid outlet.

15. A platform assembly for a chemical and/or electrolytic surface treatment of a substrate, comprising:

a first module kit according to claim 1, and an equipment platform, wherein the equipment platform comprises a platform interface, wherein the platform interface and a first kit interface of the first module kit are configured for an exchangeable cooperation between the first kit interface and the platform interface.

16. The platform assembly according to the preceding claim 15, further comprising a second module kit with a second kit interface, wherein the platform interface, the first kit interface and the second kit interface are configured for an exchangeable cooperation between the platform interface and either the first kit interface or the second kit interface.

17. The platform assembly according to claim 15, wherein the exchangeable cooperation does not require a change of a tubing, an electrical connection and/or a data connection in the equipment platform and/or the module kit(s).

18. The platform assembly according to claim 15, wherein the equipment platform comprises several platform interfaces configured for an exchangeable cooperation with several kit interfaces of several module kits at the same time.

19. A method for a chemical and/or electrolytic surface treatment of substrates, comprising:

dispensing a first liquid on a first substrate arranged in a first exchangeable dispense unit, wherein the first exchangeable dispense unit is inserted into a process chamber, and wherein a first inlet interface of the first exchangeable dispense unit cooperates with a kit interface of the process chamber, removing the first substrate from the first exchangeable dispense unit, removing the first exchangeable dispense unit from the process chamber, inserting a second exchangeable dispense unit into the process chamber, connecting the kit interface of the process chamber with a second inlet interface of the second exchangeable dispense unit, inserting a second substrate into the second exchangeable dispense unit, and dispensing a second liquid on the second substrate, wherein the kit interface, the first inlet interface and the second inlet interface are configured for an exchangeable cooperation either between the kit interface and the first inlet interface or between the kit interface and the second inlet interface.

* * * * *